United States Patent
Cho

(10) Patent No.: US 6,335,621 B1
(45) Date of Patent: Jan. 1, 2002

(54) METHOD OF COMPENSATING FOR PHASE ERROR OF PHASE ENCODING GRADIENT PULSE IN FAST SPIN ECHO IMAGING METHOD

(75) Inventor: Hyun-hwa Cho, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/707,851

(22) Filed: Nov. 8, 2000

(30) Foreign Application Priority Data

Nov. 12, 1999 (KR) .................................................. 99-50220

(51) Int. Cl.[7] .................................................. G01V 3/00
(52) U.S. Cl. ............................................. 324/314; 324/309
(58) Field of Search .................................... 324/309, 307, 324/306, 300, 312, 314, 318, 322

(56) References Cited

U.S. PATENT DOCUMENTS 5,825,185 A * 10/1998 Liu et al. .................... 324/309
6,078,176 A * 6/2000 McKinnon .................... 324/309
6,160,397 A * 12/2000 Washburn et al. ........... 324/309

* cited by examiner

*Primary Examiner*—Louis Arana
(74) *Attorney, Agent, or Firm*—The Law Offices of Eugene M. Lee, PLLC

(57) ABSTRACT

A method of compensating a phase error of a phase encoding gradient pulse in fast spin echo (FSE) imaging, wherein a bipolar type phase encoding gradient pulses for tuning are applied between a 90° RF signal and a first 180° RF signal in a FSE sequence to obtain a tuning value. Alternatively, an additional 180° RF signal is applied between a 90° RF signal and a first 180° RF signal in a FSE sequence, and then phase encoding gradient pulses for tuning are applied between the additional 180° RF signal and the first 180° RF signal to obtain a tuning value. The phase errors of the phase encoding gradient pulses are compensated for using the obtained tuning value. Accordingly, a ringing artifact or blurring phenomenon of an image can be reduced in the FSE imaging, and the contrast of an image can be improved.

6 Claims, 6 Drawing Sheets

METHOD OF COMPENSATING FOR PHASE ERROR OF PHASE ENCODING GRADIENT PULSE IN FAST SPIN ECHO IMAGING METHOD

BACKGROUND OF THE INVENTION

1. Field of the Invention

The present invention relates generally to the magnetic resonance art and, in particular, to a method for compensating for a phase error of a phase encoding gradient pulse in a fast spin echo (FSE) imaging technique.

2. Description of the Related Art

According to an FSE imaging method, different phase encoding gradients are applied to acquire the position information from an echo signal generated from a plurality of radio frequency (RF) pulses so as to obtain data corresponding to each line on a k-space and thereby construct an image. The FSE imaging method has an advantage of decreasing the imaging time to 1/4, 1/8 or shorter as compared to a conventional spin echo (SE) imaging method without image quality degradation. Accordingly, clinical attention has been focused on the FSE imaging technique.

However, in the FSE imaging technique of constructing an image from data obtained by applying different phase encoding gradients at different times, which corresponds to each line on a k-space, a constructed image may have a ringing artifact or a blurring due to a phase error when a phase encoding gradient is not linearly increased. Accordingly, a signal-to-noise ratio (SNR) or a degree of contrast may be decreased, which in turns degrades the quality of the image.

FIG. 1A illustrates pulse sequences for a conventional FSE imaging method. Corresponding to a phase encoding gradient pulse sequence shown in FIG. 1A, a k-space is filled with data obtained using phase encoding gradients, as shown in FIG. 1B. In FIG. 1B, the Kx-axis indicates a frequency encoding direction, and the Ky-axis indicates a phase encoding direction. In FIG. 1, reference numerals 1 through 8 denote gradient pulses used for application of phases. The eight gradient pulses have different amplitude. To recover the phases subjected to the gradient pulses 1 through 8 to original states, gradient pulses 11 through 18 are applied. Each gradient pulse 11 through 18 has the same amplitude as a corresponding gradient pulse 1 through 8, respectively, but with a different polarity. Therefore, the phases at positions 21 through 28 are the same.

However, it frequently happens that actually, the phases at positions 21 through 28 are not the same due to a variety of causes. In this case, a phase error occurs in the k-space. In a magnetic resonance imaging (MRI) apparatus, phase errors due to phase encoding gradients occur depending on a gradient system. Gradient offset, non-linearity of a gradient and eddy current are related to occurrence of a phase error. In particular, eddy current is fatal to the FSE imaging technique. Accordingly, an active shielded gradient is used to fundamentally prevent a magnetic field from changing due to eddy current. However, when this technique is used, the price of a gradient system becomes significantly increased, while the space for a patient in an MRI apparatus is decreased.

Meanwhile, in low-field MRI, a method of pre-emphasized gradient waveform using an eddy current compensation circuit is employed. However, since this method does not fundamentally remove eddy current, an operation of adjusting the amplitude of a gradient pulse is required. Moreover, this method cannot remove a phase error due to an external factor. Consequently, a compensation operation with respect to a phase encoding gradient pulse sequence is required to remove a phase error.

SUMMARY OF THE INVENTION

In an attempt to address the above problems, it is a feature of the present invention to provide a method of compensating for a phase error of a phase encoding gradient pulse in a fast spin echo (FSE) imaging method to improve the quality of an image.

Accordingly, in a preferred embodiment of the present invention, there is provided a method of compensating for a phase error of a phase pulse in fast spin echo imaging. The method includes the steps of (a) generating phase encoding gradient pulses for tuning encoding gradient between a 90° RF signal and a first 180° RF signal, the phase encoding gradient pulses for tuning having opposite polarities to each other and the same amplitudes as those of respectively phase encoding gradient pulses corresponding to the first 180° RF signal, (b) adjusting the amplitude of either of the phase encoding gradient pulses for tuning such that a phase before the phase encoding gradient pulses for tuning is the same as a phase behind the phase encoding gradient pulses for tuning and obtaining the adjusted amplitude, and (c) compensating for the phase errors of the phase encoding gradient pulses corresponding to the first 180° RF signal using the adjusted amplitude.

The method preferably further includes the step of (d) sequentially changing the amplitudes of the phase encoding gradient pulses for tuning to the amplitudes of phase encoding gradient pulses corresponding to second through n-th (n is an integer greater than 1) 180° RF signals and repeating the steps (b) and (c) at each change to compensate for the phase errors of the phase encoding gradient pulses corresponding to the second through n-th 180° RF signals, after the step (c).

In another preferred embodiment of the present invention, there is provided a method of compensating for a phase error of a phase encoding gradient pulse in fast spin echo imaging. The method includes the steps of (a) embedding a 180° RF signal between a 90° RF signal and a first 180° RF signal and generating a selection gradient pulse and a frequency encoding gradient pulse, which correspond to the embedded 180° RF signal, (b) generating phase encoding gradient pulses for tuning between the embedded 180° RF signal and the first 180° RF signal, each of the phase encoding gradient pulses for tuning having pulse elements which have polarities that are opposite to each other and the same amplitudes as those of respective phase encoding gradient pulses corresponding to the first 180° RF signal, (c) adjusting the amplitude of either of the phase encoding gradient pulses for tuning such that a phase before the phase encoding gradient pulses for tuning is the same as a phase behind the phase encoding gradient pulses for tuning and obtaining the adjusted amplitude, and (d) compensating for the phase error of the phase encoding gradient pulse corresponding to the first 180° RF signal using the adjusted amplitude.

The method preferably further includes the step of (e) sequentially changing the amplitudes of the phase encoding gradient pulses for tuning to the amplitudes of phase encoding gradient pulses corresponding to second through n-th (n is an integer greater than 1) 180° RF signals and repeating the steps (c) and (d) at each change to compensate for the phase errors of the phase encoding gradient pulses corresponding to the second through n-th 180° RF signals.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE PRESENT INVENTION

The present invention provides a method of obtaining a compensation value by applying an additional gradient pulse for compensating for a phase error of a phase encoding gradient pulse in a fast spin echo (FSE) imaging method. In other words, the present invention relates to a method for making the phases to be the same at the positions 21 through 28 of FIG. 1A showing a phase encoding gradient pulse sequence for a usual FSE imaging method.

Figure 1A:
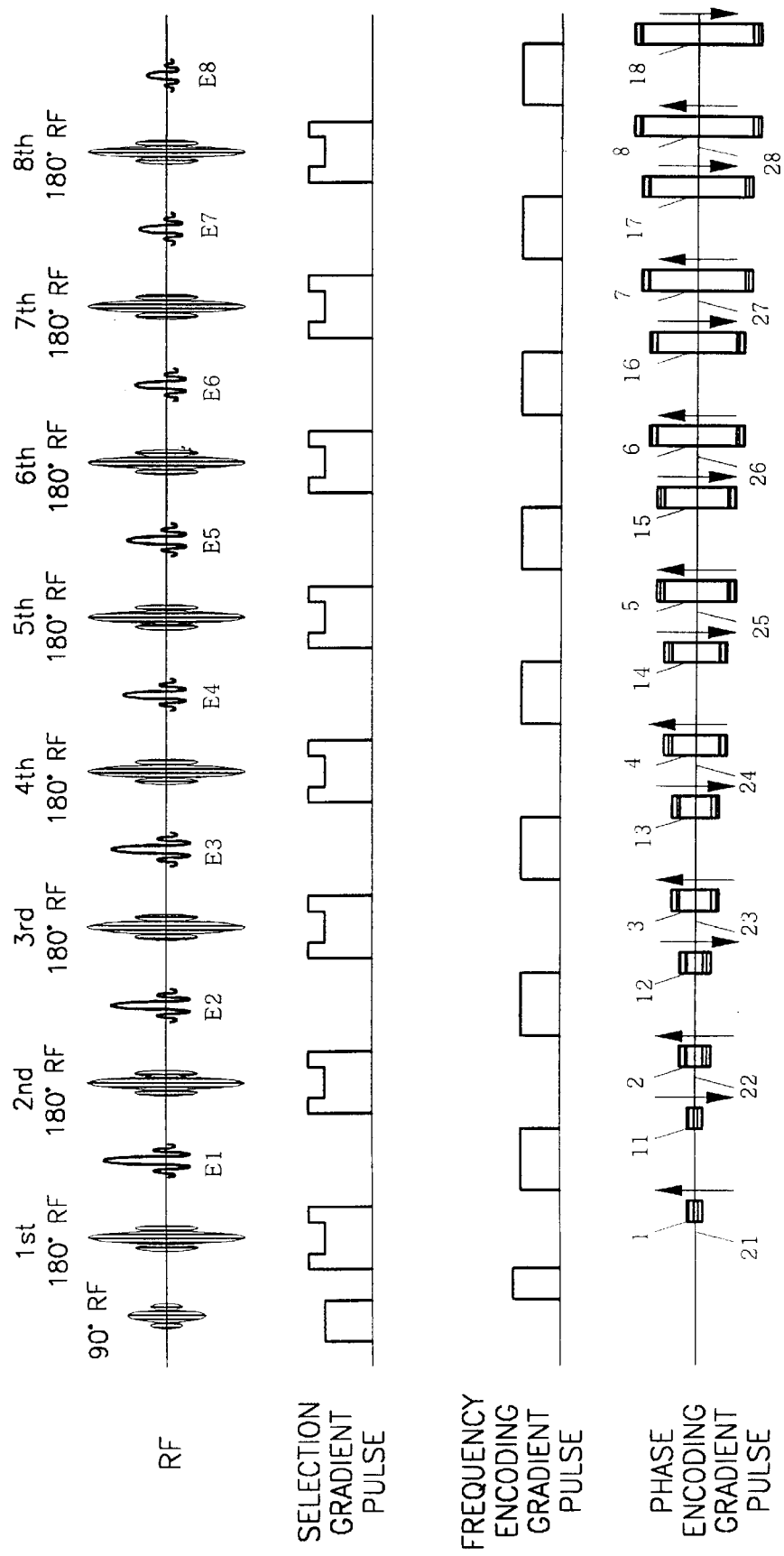
FIG. 1A illustrates a conventional fast spin echo (FSE) pulse sequence.

The present invention will be described on the basis of a FSE imaging method using a pulse sequence generating 8 echo signals as shown in FIG. 1A. In this FSE imaging method, a k-space is largely divided into 8 regions, and phase encoding gradients in the 8 regions have different initial amplitudes and are increased according to a predetermined step.

Figure 2:
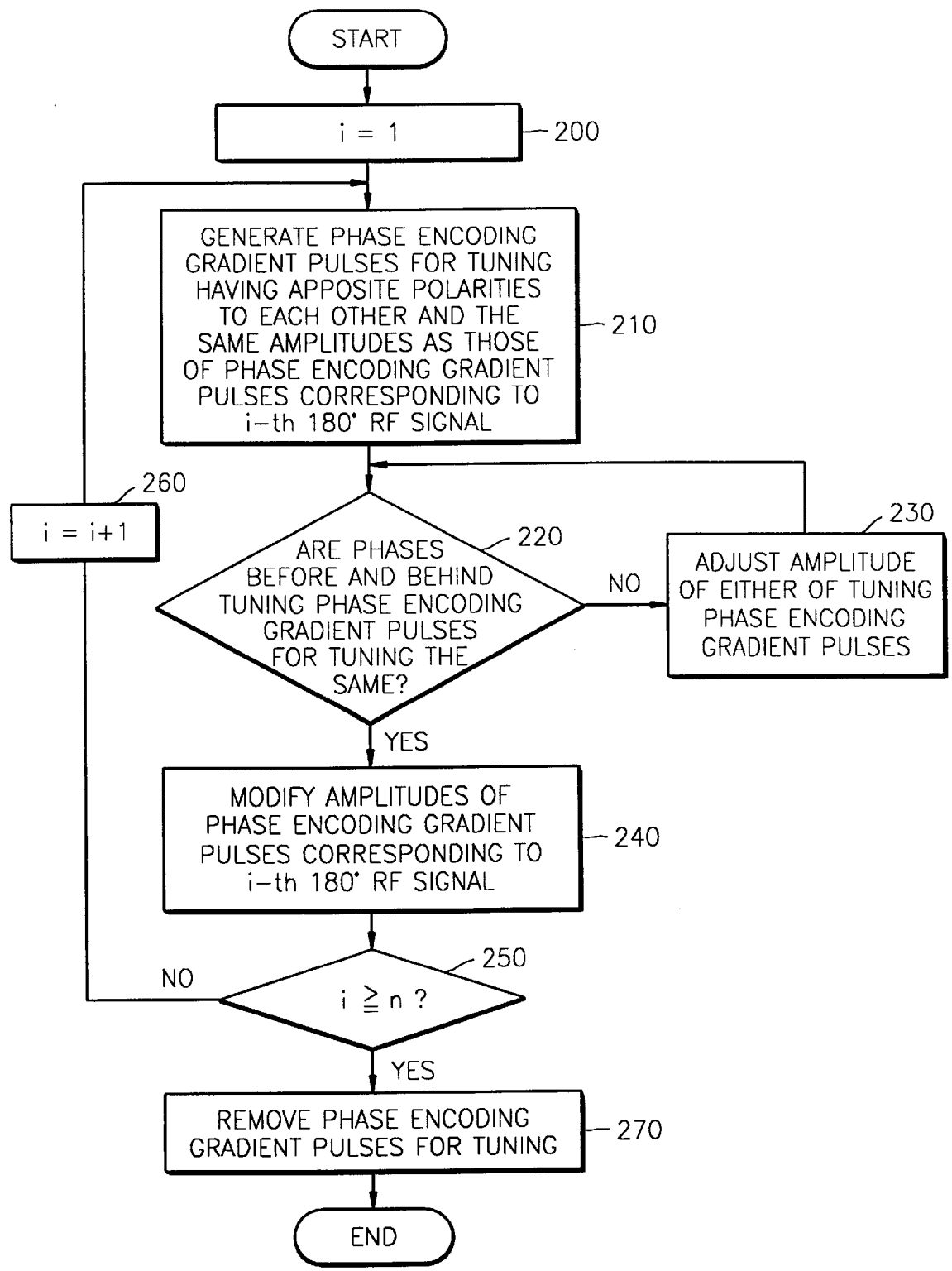
FIG. 2 is a flowchart illustrating an embodiment of a method of compensating a phase error of a phase encoding gradient pulse according to an embodiment of the present invention.
Figure 3:
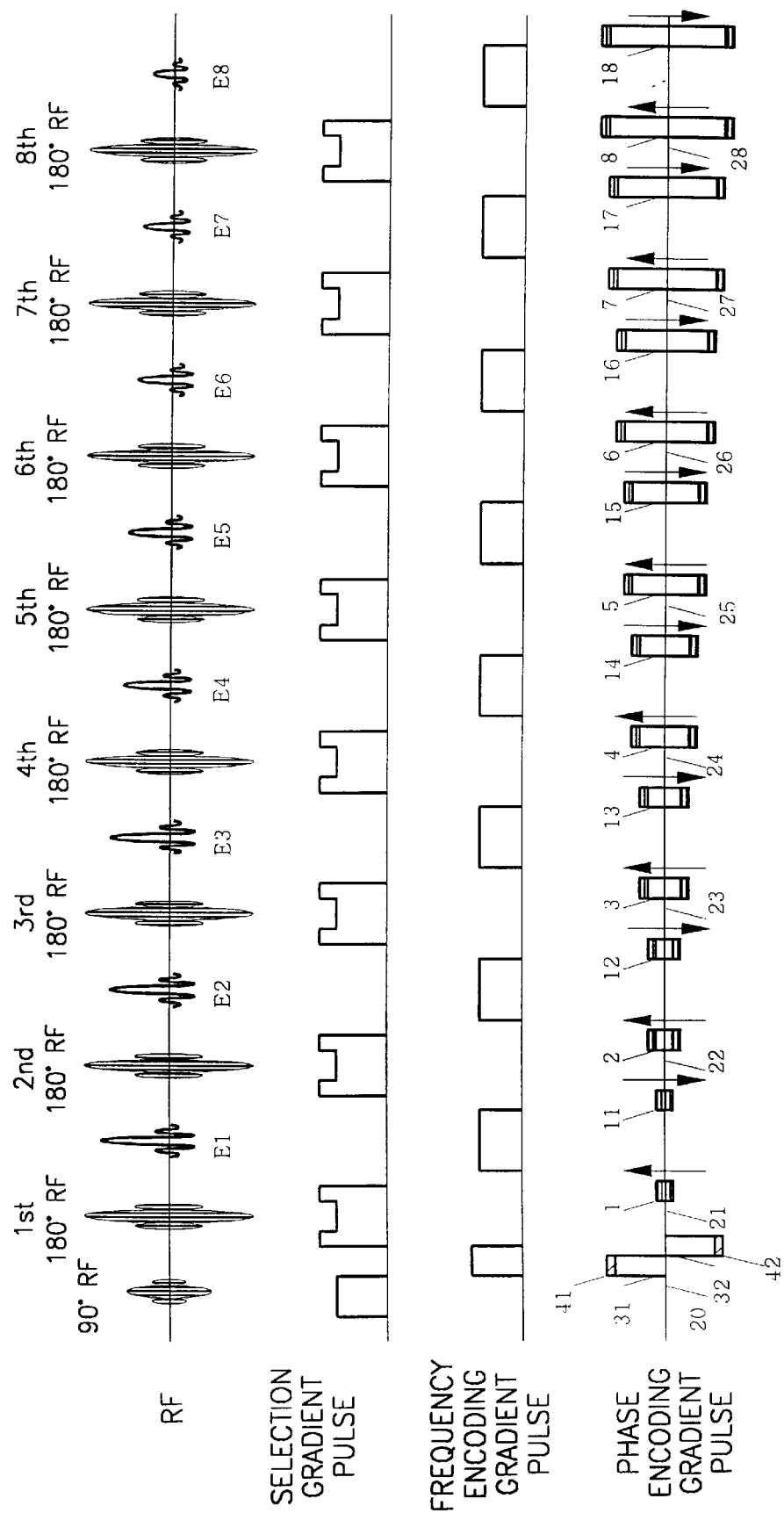
FIG. 3 illustrates a pulse sequence for the method of FIG. 2.

Referring to FIGS. 2 and 3, in an embodiment of the present invention, tuning pulses 31 and 32 having opposite polarities relative to each other and the same amplitude as phase encoding gradient pulses 1 and 11 corresponding to a first 180° radio frequency (RF) pulse are generated between a 90° RF signal and the first 180° RF signal, in step 210.

Here, the tuning pulse 31 and the tuning pulse 32 have the same magnitude and different signs, so a phase at a position 21 is ideally the same as a phase at a position 20. However, even if the tuning pulses 31 and 32 have the same magnitude, the phases at final positions 20 and 21 may actually be different. In this case, the amplitude of the tuning pulse 31 or 32 can be fine tuned by increasing or decreasing the magnitude 41 or 42 so that the phases at positions 20 and 21 can be the same, in steps 220 and 230. Since an MR signal or a spectrum varies with a change in a phase, the magnitude 41 or 42 can be adjusted while checking the MR signal or the spectrum.

In step 240, the adjusted magnitude 41 or 42 is applied to the phase encoding gradient pulses 1 and 11 corresponding to the first 180° RF signal. Here, the magnitude 41 or 42 indicates the difference between the magnitude of an initially generated phase encoding gradient pulse for tuning and the magnitude of the adjusted phase encoding gradient pulse for tuning, and is used as a tuning value or a compensation value.

Thereafter, while the amplitudes of the tuning pulses 31 and 32 are sequentially changed into the amplitudes of pairs of phase encoding gradient pulses 2 through 8 and 12 through 18 corresponding to second through eighth 180° RF signals, respectively, the steps 210 through 240 are repeated, thereby compensating phase errors of the phase encoding gradient pulses corresponding to the respective second through eighth 180° RF signals. Steps 200, 250 and 260 in FIG. 2 are required to repeat the steps 210 through 240 n times in the case of an n-echo train FSE imaging method.

Figure 1B:
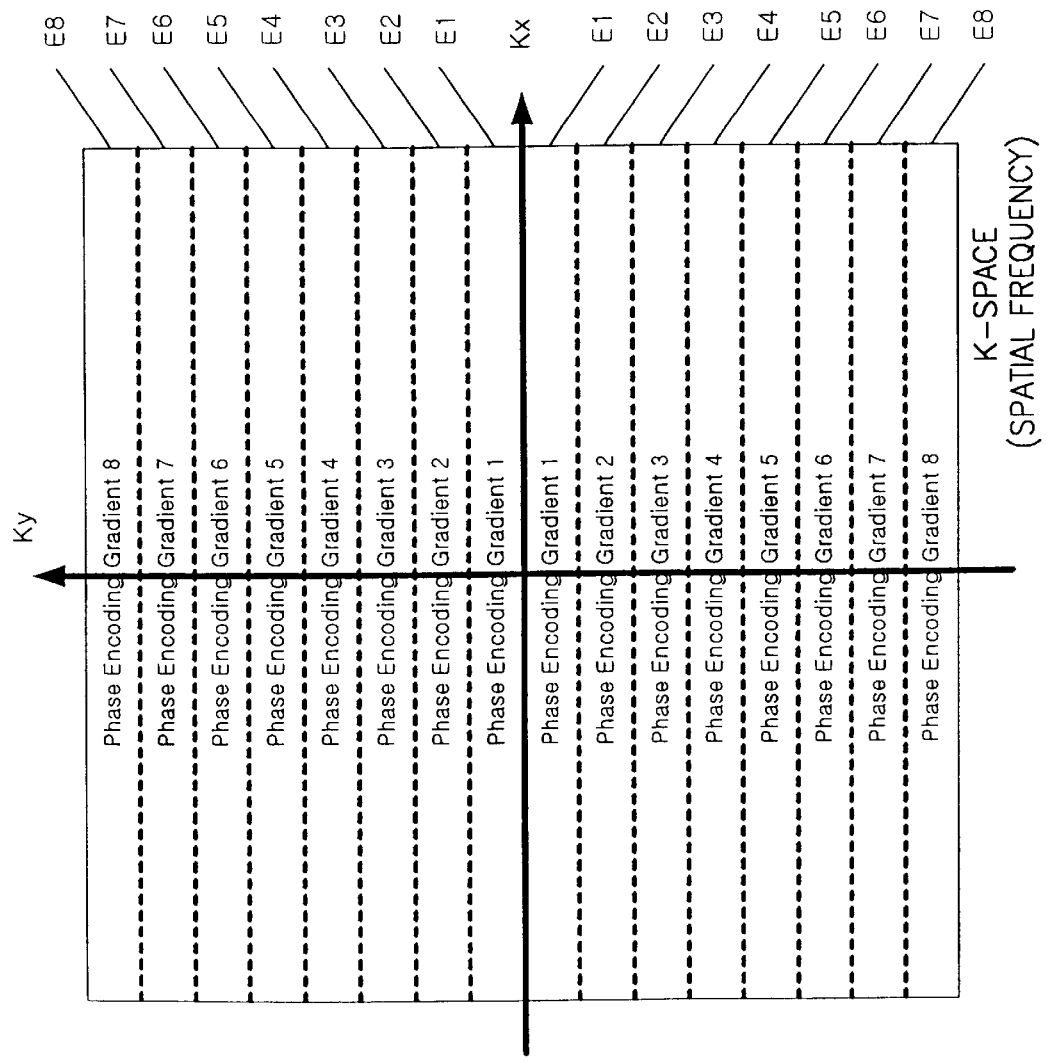
FIG. 1B illustrates a k-space scan method corresponding to FIG. 1A.

Meanwhile, when the data of image is actually acquired, the tuning pulses 31 and 32 may be removed from the phase encoding gradient pulse sequence, in step 270. Thereafter, the constructed image is verified after data acquisition, as shown in FIG. 1B. Here, the data for constructing the image is obtained from an echo train E1 through E8.

In the embodiment shown in FIGS. 2 and 3, phase encoding gradient pulses for tuning 31 and 32 do not need to be generated at the same time when all phase encoding gradient pulses are generated. In addition, the phase encoding gradient pulses for tuning 31 and 32 are independent from the effect of a selection gradient pulse and a frequency encoding gradient pulse.

Figure 4:
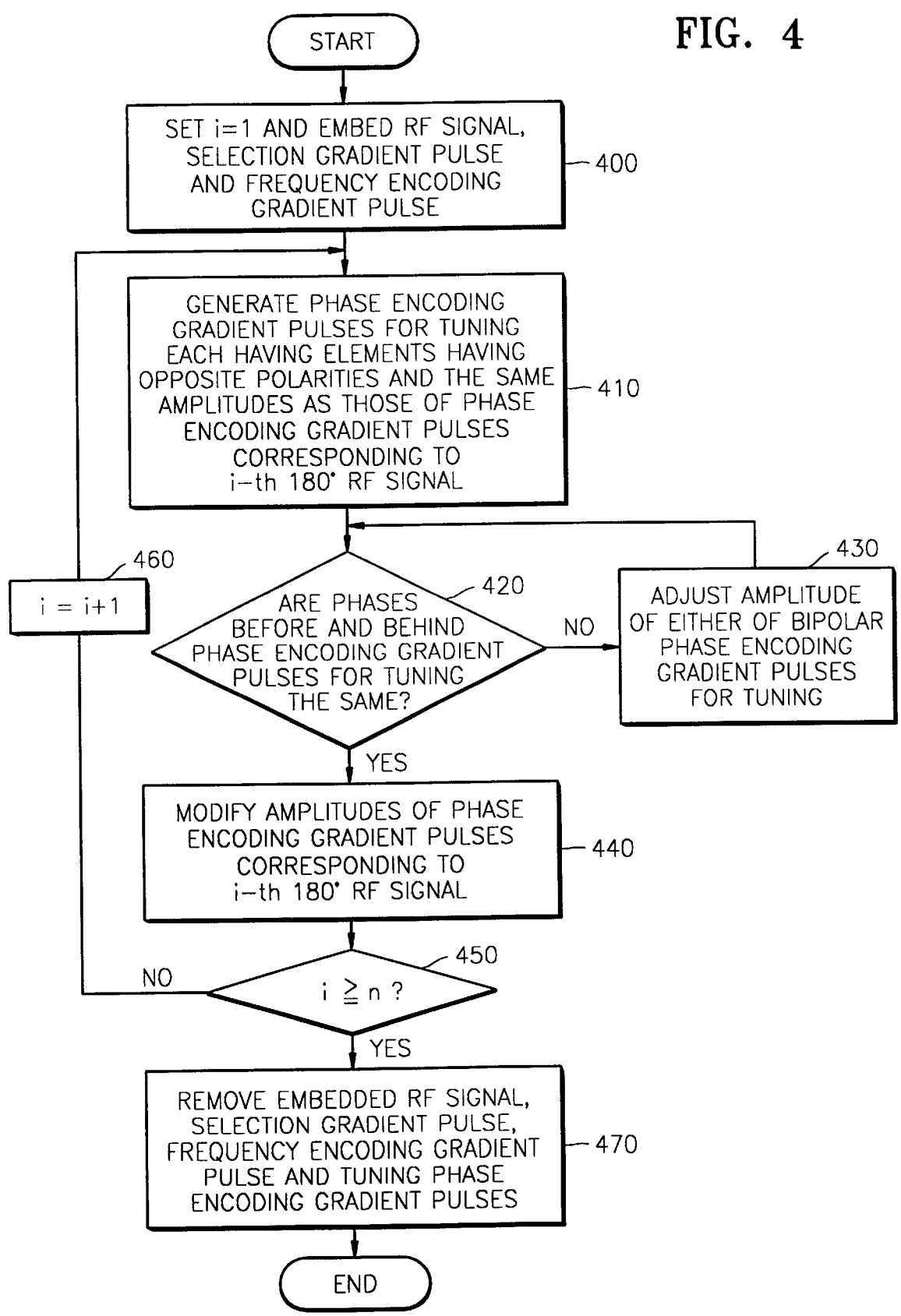
FIG. 4 is a flowchart illustrating a method of compensating a phase error of a phase encoding gradient pulse according to another embodiment of the present invention.
Figure 5:
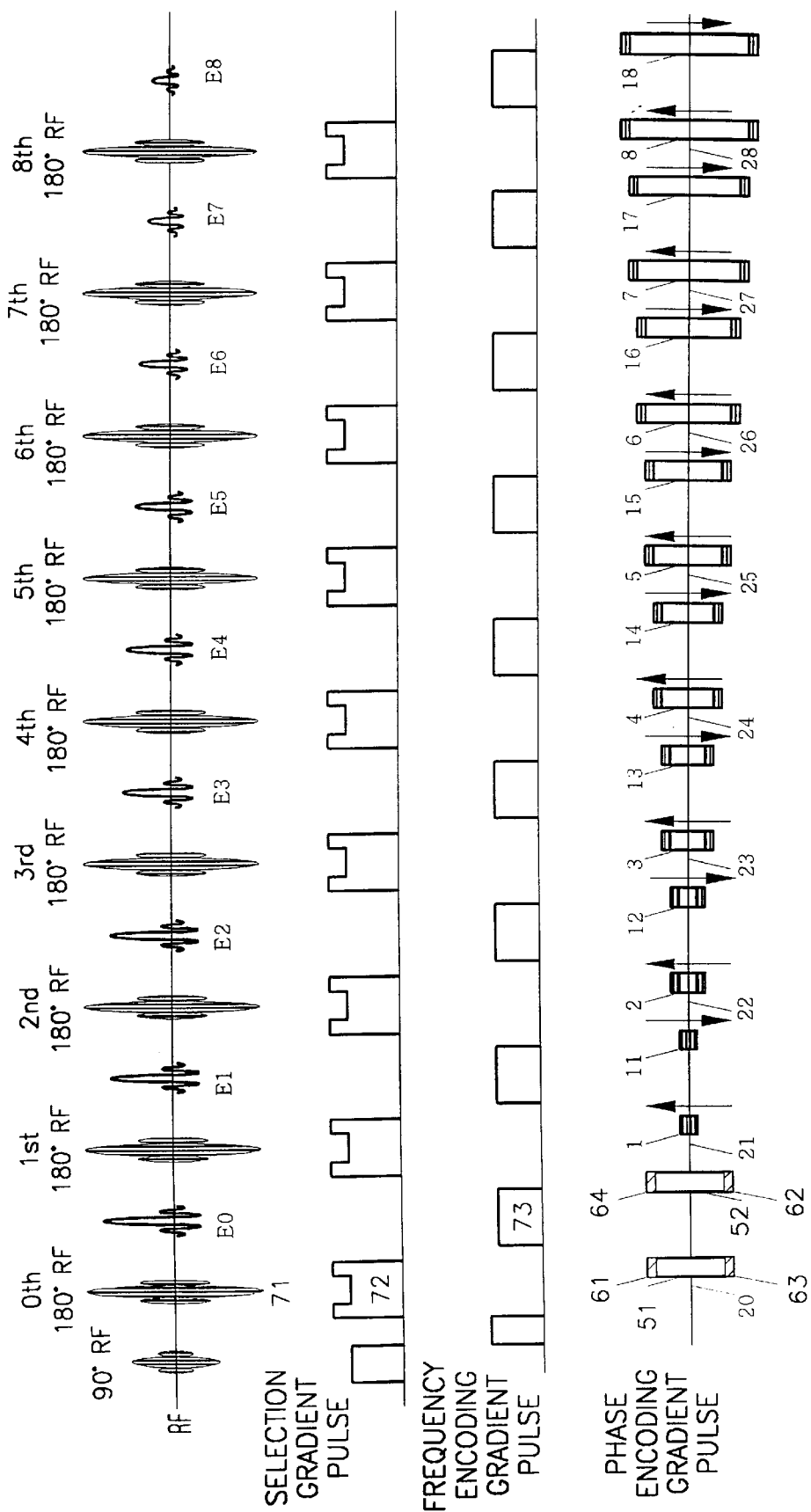
FIG. 5 illustrates a pulse sequence for the method of FIG. 4.

Referring to FIGS. 4 and 5, in another embodiment of the present invention, a 180° RF signal 71 is embedded between a 90° RF signal and a first 180° RF signal, and a selection gradient pulse 72 and a frequency encoding gradient pulse 73 which correspond to the embedded RF signal 71 are generated, in step 400. Next, phase encoding gradient pulses for tuning 51 and 52 each having pulse elements, which have different polarities to each other and the same amplitude as those of phase encoding gradient pulses 1 and 11 corresponding to the first 180° RF signal, are generated between the embedded 180° RF signal 71 and the first 180° RF signal, in step 410.

Here, each of the phase encoding gradient pulses for tuning 51 and 52 has two pulse elements having the same magnitude and opposite polarities, so a phase at a position 21 is ideally the same as a phase at a position 20. However, the phases at positions 20 and 21 may actually be different due to a variety of causes. In this case, the amplitude of the tuning phase encoding gradient pulse 51 or 52 can be fine tuned or adjusted by increasing or decreasing a magnitude 61 or 62 (when an image is acquired using positive phase encoding gradient pulses) or a magnitude 63 or 64 (when an image is acquired using positive phase encoding gradient pulses) so that the phases at positions 20 and 21 can be the same, in steps 420 and 430. Since an MR signal or a spectrum varies with a change in a phase, the magnitude 61, 62, 63 or 64 can be adjusted while checking the MR signal or the spectrum.

In step 440, the adjusted magnitude 61, 62, 63 or 64 is applied to the phase encoding gradient pulses 1 and 11 corresponding to the first 180° RF signal. Thereafter, while the amplitudes of the phase encoding gradient pulses for tuning 51 and 52 are sequentially changed into the amplitudes of pairs of phase encoding gradient pulses 2 through 8 and 12 through 18, corresponding to second through eighth 180° RF signals, respectively, the steps 410 through 440 are repeated, thereby compensating phase errors of the phase encoding gradient pulses corresponding to the respective second through eighth 180° RF signals. A step 400 of initializing n to 1 and steps 450 and 460 in FIG. 4 are required to repeat the steps 410 through 440 n times in the case of an n-echo train FSE imaging method.

Meanwhile, when the data of image is actually acquired, the 180° RF signal and the selection gradient pulse and the frequency encoding gradient pulse corresponding to the 180° RF signal, which are embedded in step 400, and the phase encoding gradient pulses for tuning 51 and 52 generated in step 410 may be removed in step 470. Thereafter, the constructed image is verified after data acquisition as shown in FIG. 1B. Here, the data for constructing the image is obtained from an echo train E1 through E8.

The embodiment of FIGS. 2 and 3 is different from the embodiment of FIGS. 4 and 5 in the following term. In FIG. 3, a tuning gradient pulse for compensating a phase encoding gradient pulse is positioned between the 90° RF signal and the first 180° RF signal. In FIG. 5, an additional RF signal is embedded between the 90° RF signal and the first 180° RF signal, and a tuning gradient pulse for compensating a phase encoding gradient pulse is positioned between the embedded RF signal and the first 180° RF signal.

In these embodiments of the present invention, an effective echo time (TE) may be changed, and accordingly, the arrangement of phase encoding gradient pulses for an echo train may also be changed.

According to the present invention, the ringing artifact or blurring of an image can be decreased in a FSE imaging method, and the contrast of an image can be improved. In addition, time for the development of a pulse sequence and the maintenance of a system can be saved, and information for grasping the problems of a gradient system can be obtained.

What is claimed is:

1. A method of compensating for a phase error of a phase encoding gradient pulse in fast spin echo imaging, the method comprising the steps of:

(a) generating phase encoding gradient pulses for tuning between a 90° RF signal and a first 180° RF signal, the phase encoding gradient pulses for tuning having opposite polarities to each other and the same amplitudes as those of respectively phase encoding gradient pulses corresponding to the first 180° RF signal;

(b) adjusting the amplitude of either of the phase encoding gradient pulses for tuning such that a phase before the phase encoding gradient pulses for tuning is the same as a phase behind the phase encoding gradient pulses for tuning and obtaining the adjusted amplitude; and (c) compensating for the phase errors of the phase encoding gradient pulses corresponding to the first 180° RF signal using the adjusted amplitude.

2. The method claim 1, further comprising the step of (d) sequentially changing the amplitudes of the phase encoding gradient pulses for tuning to the amplitudes of phase encoding gradient pulses corresponding to second through n-th (n is an integer greater than 1) 180° RF signals and repeating the steps (b) and (c) at each change to compensate for the phase errors of the phase encoding gradient pulses corresponding to the second through n-th 180° RF signals, after the step (c).

3. The method of claim 2, further comprising the step of (e) removing the phase encoding gradient pulses for tuning, after the step (d).

4. A method of compensating for a phase error of a phase encoding gradient pulse in fast spin echo imaging, the method comprising the steps of:

(a) embedding a 180° RF signal between a 90° RF signal and a first 180° RF signal and generating a selection gradient pulse and a frequency encoding gradient pulse, both pulses corresponding to the embedded 180° RF signal;

(b) generating phase encoding gradient pulses for tuning between the embedded 180° RF signal and the first 180° RF signal, the phase encoding gradient pulses for tuning having two pulse elements, which have opposite polarities to each other and the same amplitudes as those of respective phase encoding gradient pulses corresponding to the first 180° RF signal;

(c) adjusting the amplitude of the phase encoding gradient pulses for tuning such that a phase before the phase encoding gradient pulses for tuning is the same as a phase behind the phase encoding gradient pulses for tuning, and obtaining the adjusted amplitude; and (d) compensating for the phase error of the phase encoding gradient pulse corresponding to the first 180° RF signal using the adjusted amplitude.

5. The method of claim 4, further comprising the step of (e) sequentially changing the amplitudes of the phase encoding gradient pulses for tuning to the amplitudes of phase encoding gradient pulses corresponding to second through n-th (n is an integer greater than 1) 180° RF signals and repeating the steps (c) and (d) at each change to compensate for the phase errors of the phase encoding gradient pulses corresponding to the second through n-th 180° RF signals.

6. The method of claim 5, further comprising the step of (f) removing the 180° RF signal which is embedded in the step (a), and the selection gradient pulse and the frequency encoding gradient pulse which correspond to the embedded 180° RF signal, and removing the phase encoding gradient pulses for tuning generated in the step (b), after the step (e).

* * * * *